(12) United States Patent
Ikegami

(10) Patent No.: US 7,153,716 B2
(45) Date of Patent: Dec. 26, 2006

(54) METHOD OF MANUFACTURING A MICRO-ELECTRICAL-MECHANICAL SYSTEM

(75) Inventor: Naokatsu Ikegami, Saitama (JP)

(73) Assignee: Oki Electric Industry Co., Ltd., Tokyo (JP)

(*) Notice: Subject to any disclaimer, the term of this patent is extended or adjusted under 35 U.S.C. 154(b) by 118 days.

(21) Appl. No.: 11/065,062

(22) Filed: Feb. 25, 2005

(65) Prior Publication Data

US 2005/0266599 A1  Dec. 1, 2005

(30) Foreign Application Priority Data

May 31, 2004  (JP)  ............... 2004-162339

(51) Int. Cl.
   *H01L 21/00*  (2006.01)
(52) U.S. Cl. ............... 438/51; 438/52; 438/113; 438/464
(58) Field of Classification Search ............ 438/48–53, 438/106–127, 455, 465; 216/2
   See application file for complete search history.

(56) References Cited

U.S. PATENT DOCUMENTS

| | | | | |
|---|---|---|---|---|
| 5,723,353 A | * | 3/1998 | Muenzel et al. | 438/48 |
| 5,991,990 A | * | 11/1999 | Bernstein | 29/25.41 |
| 6,187,607 B1 | * | 2/2001 | Offenberg et al. | 438/48 |
| 6,287,885 B1 | * | 9/2001 | Muto et al. | 438/48 |
| 6,425,971 B1 | * | 7/2002 | Silverbrook | 156/230 |
| 6,458,615 B1 | * | 10/2002 | Fedder et al. | 438/50 |
| 6,846,692 B1 | * | 1/2005 | Silverbrook | 438/51 |
| 6,962,832 B1 | * | 11/2005 | Chou | 438/52 |
| 2005/0009233 A1 | * | 1/2005 | Park et al. | 438/108 |
| 2006/0046437 A1 | * | 3/2006 | Ozawa | 438/462 |

* cited by examiner

*Primary Examiner*—Savitri Mulpuri
(74) *Attorney, Agent, or Firm*—Rabin & Berdo, PC

(57) ABSTRACT

Micro-electrical-mechanical systems are fabricated in a substrate having a sacrificial layer sandwiched between two semiconductor layers. The semiconductor layers are selectively etched to create non-etched frames and etched microstructures immobilized within the frames by the sacrificial layer. An adhesive sheet is attached to one surface of the substrate, and the substrate is diced into chips, each including one frame and one immobilized microstructure. The sacrificial layer is then selectively etched to free a movable member in each microstructure. Finally, the chips are detached from the adhesive sheet, each chip becoming a micro-electrical-mechanical system. This fabrication method provides a simple and inexpensive way to avoid damage to the microstructure during the dicing process.

18 Claims, 9 Drawing Sheets

METHOD OF MANUFACTURING A MICRO-ELECTRICAL-MECHANICAL SYSTEM

BACKGROUND OF THE INVENTION

1. Field of the Invention

The present invention relates to a method of manufacturing a micro-electrical-mechanical system.

2. Description of the Related Art

It is known art to use semiconductor fabrication techniques in micro-machining processes that create structures with sizes on the order of a few hundred micrometers. Applications of this technology are beginning to appear in sensors, optical communication switches, radio-frequency (RF) devices, and other areas.

Because these tiny structures can be manufactured by conventional semiconductor fabrication processes, they can be integrated together with signal processing circuitry, for example, onto a single chip. Chips of this type, which combine electronics with mechanics, are known as micro-electrical-mechanical systems (MEMS), and the technology they embody is known as microsystem technology (MST). The chips will be referred to as MEMS devices below.

Acceleration sensors are a well-known example of a MEMS device. A method of manufacturing a piezoelectric acceleration sensor is described in Japanese Unexamined Patent Application Publication No. H7-225540. First a plurality of masses and a plurality of beams movably supporting the masses are formed on a silicon substrate; then the masses and beams are reinforced with a polyimide film, and the substrate is diced into chips, each including one mass and its supporting beams, which are fabricated as a unitary structure. Finally, the polyimide film is removed from each chip, so that the mass can move in response to acceleration.

The need to apply a polyimide reinforcing film and then remove the film individually from each chip after dicing makes this manufacturing method undesirably lengthy and complex. A further problem is low yield, because despite the reinforcement, the beams are vulnerable to damage during the dicing process. The manufacturing cost per chip is accordingly comparatively high.

SUMMARY OF THE INVENTION

An object of the present invention is to provide a simplified method of manufacturing a MEMS device having a movable member.

A further object is to improve the manufacturing yield by preventing damage to the MEMS device during the manufacturing process, particularly the dicing process.

The invented method of fabricating a MEMS device begins from a substrate comprising a sacrificial layer sandwiched between a first semiconductor layer disposed on a first side of the substrate and a second semiconductor layer disposed on a second side of the substrate. The substrate includes a plurality of chip areas, each chip area comprising a peripheral area and an interior area. The substrate is selectively etched from both sides to remove part of the first semiconductor layer and part of the second semiconductor layer from the interior of each chip area without removing the sacrificial layer, thereby leaving a frame in the peripheral area and forming a microstructure within the interior area. The microstructure includes a movable member that, at this stage, is secured to the frame and immobilized by the sacrificial layer. The microstructure may also include one or more beams that attach the movable member to the frame; at this stage, the beams preferably comprise parts of the first semiconductor layer and the sacrificial layer.

Next, an adhesive sheet is attached by its adhesive surface to the second side of the substrate, and the substrate is diced from the first side down at least to the adhesive surface, thereby dividing the substrate into chips. The dicing process does not cut through the adhesive sheet.

After the substrate has been diced, the exposed parts of the sacrificial layer are etched, freeing the movable member from the frame, and the chips are removed from the sheet. The adhesion of the sheet is preferably weakened, by exposure to ultraviolet light or heat, for example, before the chips are removed.

During the dicing process, since the moving member is immobilized by the sacrificial layer, it cannot stress or damage the microstructure by moving, and the beams, if present, are also reinforced by the sacrificial layer for further protection from stress and damage. This protection is attained without the need to form and then remove a separate reinforcing layer. The sacrificial layer may be removed from the beams by the etching process that frees the moving member from the frame.

DETAILED DESCRIPTION OF THE INVENTION

Figure 1:
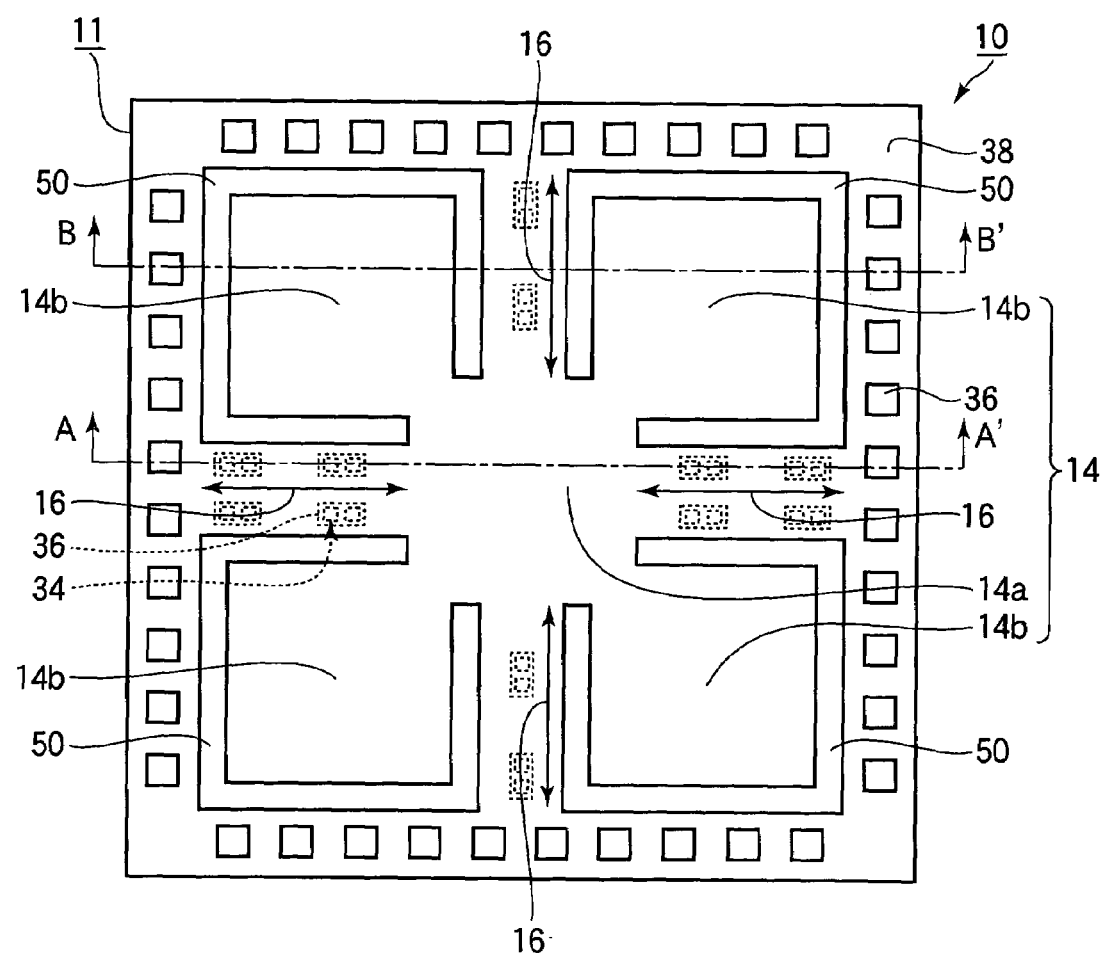
FIG. 1 is a frontal plan view of a semiconductor acceleration sensor embodying the present invention.
Figure 2:
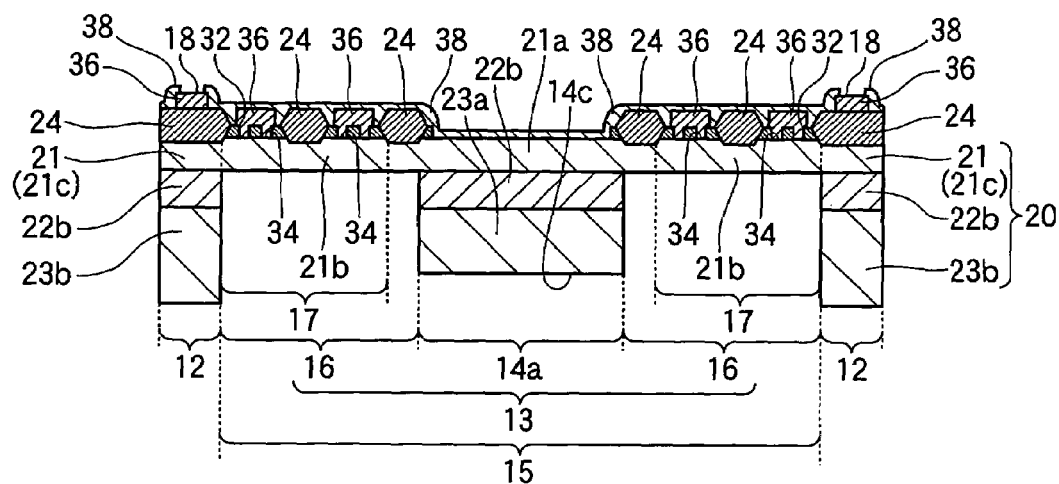
FIG. 2 is a sectional view through line A–A' in FIG. 1.
Figure 3:
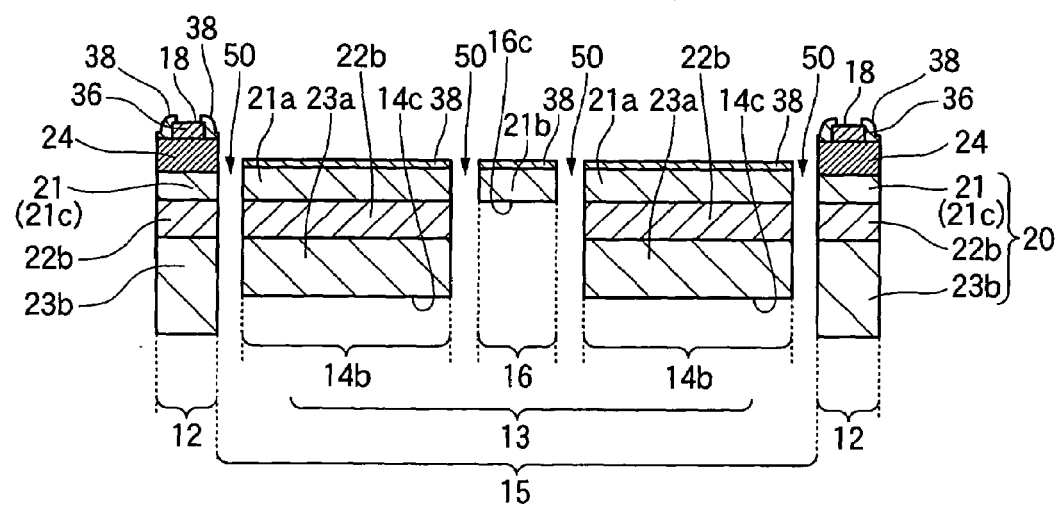
FIG. 3 is a sectional view through line B–B' in FIG. 1.

Embodiments of the invention will now be described with reference to the attached drawings, in which like elements are indicated by like reference characters. The drawings have been drafted so as to provide an understanding of the invention, but they depict the shapes, sizes, and positional relationships of the constituent elements only schematically, and should not be construed as limiting the scope of the invention. Similarly, the materials, processing parameters, and other values given below are only examples of preferred conditions, not limiting the scope of the invention.

FIGS. 1, 2, 3, and 4 illustrate a MEMS device that may be advantageously manufactured by the invented method. The device is a piezoelectric three-axis semiconductor acceleration sensor 10 by which an arbitrary acceleration can be measured. The semiconductor acceleration sensor 10 is fabricated in a generally flat rectangular chip 11, the peripheral part of which functions as a frame 12. The frame 12 encloses a microstructure 13 comprising a movable member 14, which can move within a recess 15 inside the frame 12. The microstructure 13 also comprises beams 16 by which the movable member 14 is connected to the frame 12.

Figure 5:
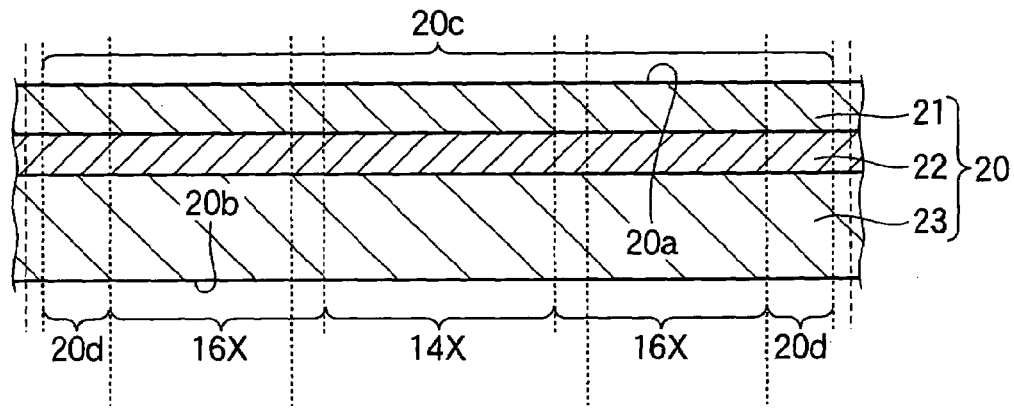
FIGS. 5, 6, 7, 8, 9, 10, 11, 12, 13, 14, 15, 16, 17, and 18 are sectional views illustrating steps in a fabrication process for the semiconductor acceleration sensor in FIG. 1.

The movable member 14, beams 16, and frame 12 comprise respective parts 21a, 21b, and 21c of a first semiconductor layer 21 which, being made of silicon, will be referred to below as the first silicon layer. The movable member 14 and frame 12 also include part 22b of a sacrificial layer 22 and parts 23a, 23b of a second semiconductor layer 23. (The entire sacrificial layer 22 and second semiconductor 23 are shown in FIG. 5.) The second semiconductor layer 23 is also a layer of silicon, and will be referred to below as the second silicon layer.

The movable member 14 and beams 16 are joined by the shared first silicon layer 21 to form a unitary structure. Similarly, the frame 12 and beams 16 are joined by the shared first silicon layer to form a unitary structure. The frame 12 thereby supports the beams 16, which support the movable member 14. Because the movable member 14 must be able to move in response to an external acceleration force, it is separated by grooves 50 from the frame 12 and from the sides of the beams 16. The grooves 50 penetrate completely through the semiconductor acceleration sensor 10, from its front (upper) surface down to the recess 15, allowing the beams 16 to flex and the movable member 14 to move in relation to the frame 12.

The parts of the sacrificial layer 22 and second silicon layer 23 disposed in the movable member 14 provide the movable member 14 with rigidity and inertial mass. The beams 16, in contrast, are elongate thin plates that can bend with the movement of the movable member 14.

The recess 15 extends from the back (lower) surface of the semiconductor acceleration sensor 10 to the undersurfaces 16c of the beams 16 and the undersurface 14c of the movable member. The undersurfaces 16c of the beams 16 are undersurfaces of the included parts 21b of the first silicon layer 21; the undersurface 14c of the movable member 14 is the undersurface of the included part 23a of the second silicon layer.

In the example shown in FIGS. 1 to 4, the frame 12 is square and there are four beams 16 projecting at right angles from the centers of the four sides of the frame 12 toward the interior thereof. As seen in plan view (FIG. 4), the central part 14a of the movable member 14 has a square shape. The ends of the four projecting beams 16 connect with and support the movable member 14 at the centers of the four sides of its central part 14a. The movable member 14 also has four petal-like parts 14b that extend from the corners of the central part 14a toward the frame 12, increasing the mass of the movable member 14.

Functional circuit elements 17 for measuring acceleration are formed in the beams 16. More specifically, the parts 21b of the first silicon layer 21 constituting the beams 16 are treated as described later to function as piezoresistive elements. The beams 16 are covered by a thermal oxide layer 32 having contact holes 34 through which wiring 36 for external signal output makes contact with the piezoresistive parts of the first silicon layer 21. The number of contact holes 34 and their locations are design choices that determine the electrical response of the semiconductor acceleration sensor 10 to acceleration forces. The contact holes 34 should be positioned to provide a response suitable for measuring acceleration of the magnitude of interest in the directions of interest. The wiring 36 can be formed of a conventional material such as, for example, aluminum (Al). A passivation layer 38 is also formed on the top surface of the semiconductor acceleration sensor 10.

The wiring 36 leads from the functional elements 17 in the beams 16 to electrode pads 18 in the frame 12. In this embodiment, the electrode pads 18 are simply parts of the wiring 36 that are exposed by openings in the passivation layer 38.

The microstructure 13 of the semiconductor acceleration sensor 10 thus comprises the movable member 14, the beams 16, and their functional elements 17, all of which are disposed above the recess 15. The functional elements 17 are mutually isolated by oxide regions 24.

Next, the operation of this semiconductor acceleration sensor 10 will be briefly described.

When acceleration acts on the semiconductor acceleration sensor 10, the movable member 14 is displaced and its supporting beams 16 are correspondingly strained. The strain alters the electrical resistance of the functional elements 17 in the beams 16. The resistance of the functional elements 17 is measured by an external sensor circuit (not shown) connected to the functional elements 17 through the electrode pads 18 and wiring 36. The acceleration acting on the semiconductor acceleration sensor 10 is thus detected quantitatively as a change in resistance.

Methods of manufacturing the semiconductor acceleration sensor 10 will now be described. The methods are presented as two embodiments, differing in the type of adhesive sheet used, but sharing the common feature that a plurality of acceleration sensors are fabricated from a single semiconductor wafer substrate that is diced into chips before the microstructure 13 is completed.

FIRST EMBODIMENT

The adhesive sheet in the first embodiment is a so-called UV sheet. The term UV sheet is used herein to denote a flat sheet made of a base material such as polyester, having on one surface an adhesive substance, the adhesive strength of which is weakened by exposure to ultraviolet (UV) light.

Two slightly different fabrication methods conforming to the first embodiment will be described with reference to FIGS. 5 to 18. These drawings show one representative acceleration sensor among the plurality of acceleration sensors that are simultaneously fabricated in a single wafer substrate. Each acceleration sensor 10 has the exemplary structure shown in FIGS. 1–4.

Both fabrication methods start from a semiconductor substrate 20 having a first major surface 20a (defined as the front surface or upper surface) and a second major surface 20b (defined as the back surface or lower surface) as shown in FIG. 5. The semiconductor substrate 20 comprises a sacrificial layer 22 sandwiched between a first silicon layer 21 and second silicon layer 23 as depicted in FIG. 5. It will be assumed below that the semiconductor substrate 20 is a commercially available silicon-on-insulator (SOI) wafer in which the sacrificial layer 22 is a layer of silicon oxide, generally known as a buried oxide layer or BOX layer. The semiconductor substrate 20 is not limited to this SOI structure, however; any substrate having an interior sacrificial layer may be used.

The semiconductor substrate 20 comprises a plurality of chip areas 20c, each of which will become an acceleration sensor 10. FIG. 5 shows one chip area 20c.

A peripheral frame area 20d is defined in each chip area 20c in the semiconductor substrate 20. The peripheral frame area 20d comprises the peripheral part of the chip area 20c and functions as a frame surrounding the interior part of the chip area. The interior part includes a movable member area 14X in which the movable member will be formed, and beam areas 16X in which beams will be formed. The microstructure comprising the movable member and beams is created as follows.

Figure 6:
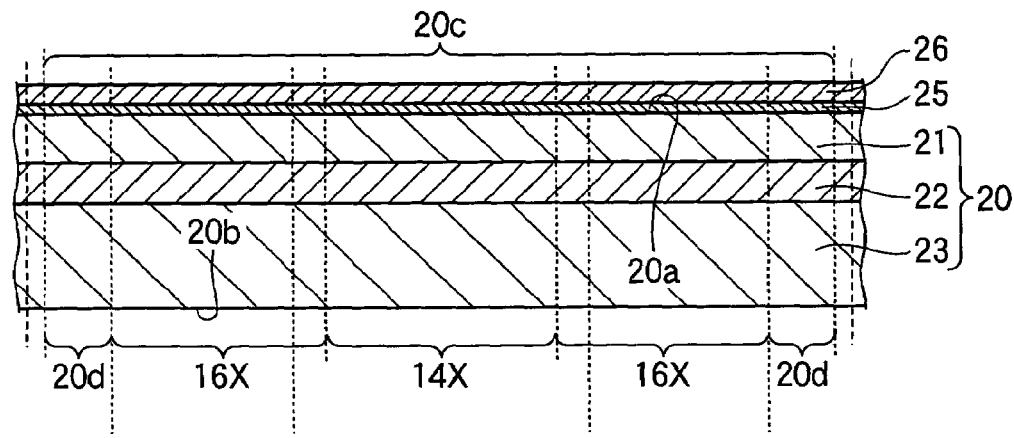

First, as shown in FIG. 6, a pad oxide film 25 and a silicon nitride film 26 are formed on the first silicon layer 21 of the semiconductor substrate 20, more specifically on its first major surface 20a, by well-known methods.

Figure 7:
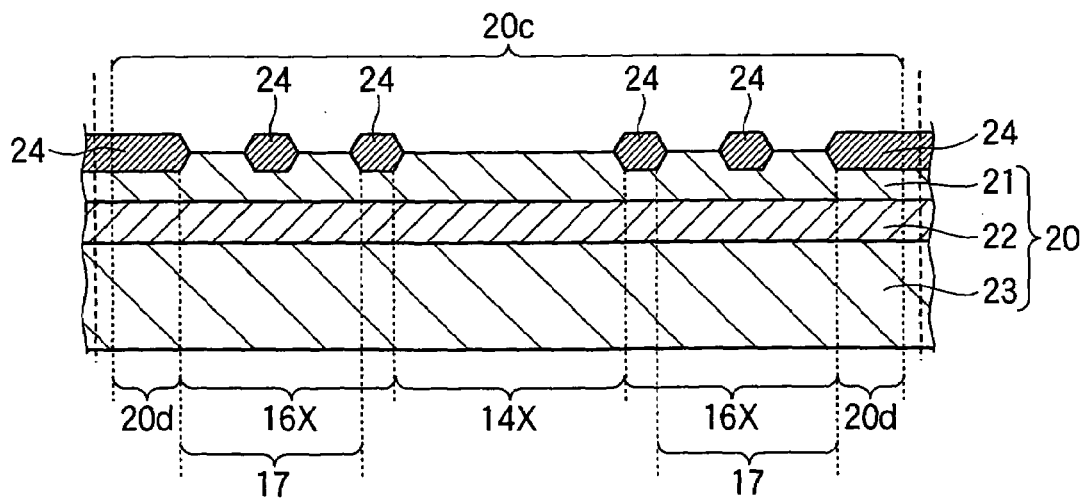

The pad oxide film 25 and silicon nitride film 26 are patterned by conventional photolithography and etching processes to form a mask pattern for local oxidation. The well-known local oxidation of silicon (LOCOS) process is then carried out to form oxide regions 24 as shown in FIG. 7, to isolate the functional elements that will be formed later. The pad oxide film 25 and silicon nitride film 26 are removed after this local oxidation process.

Next, standard semiconductor fabrication methods are used to form the piezoresistive functional elements 17.

Figure 8:
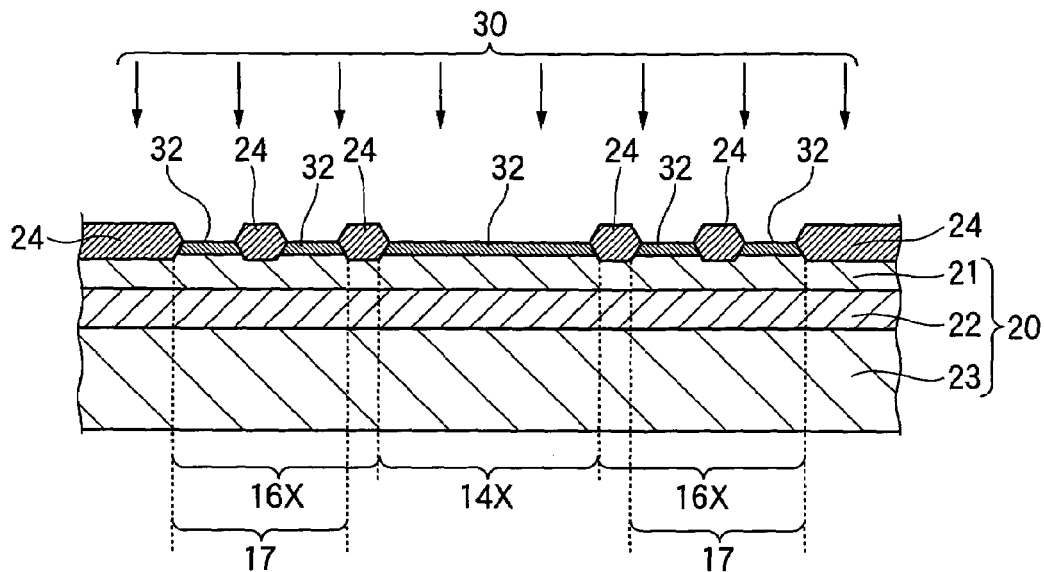

First, ion implantation is performed as shown in FIG. 8, using the LOCOS oxide regions 24 as a mask. This ion implantation process may be performed by using conventional ion implantation equipment. Ions 30 of a p-type impurity such as boron (B) are implanted into the first silicon layer 21 in the areas not protected by the oxide regions 24. The implanted ions are then thermally diffused within the first silicon layer 21. During the diffusion process, a thermal oxide layer 32 is formed on the semiconductor substrate 20 in the areas not already occupied by the LOCOS oxide 24. These ion implantation and thermal diffusion steps create regions with a piezoresistive function in the beam areas 16X.

Figure 9:
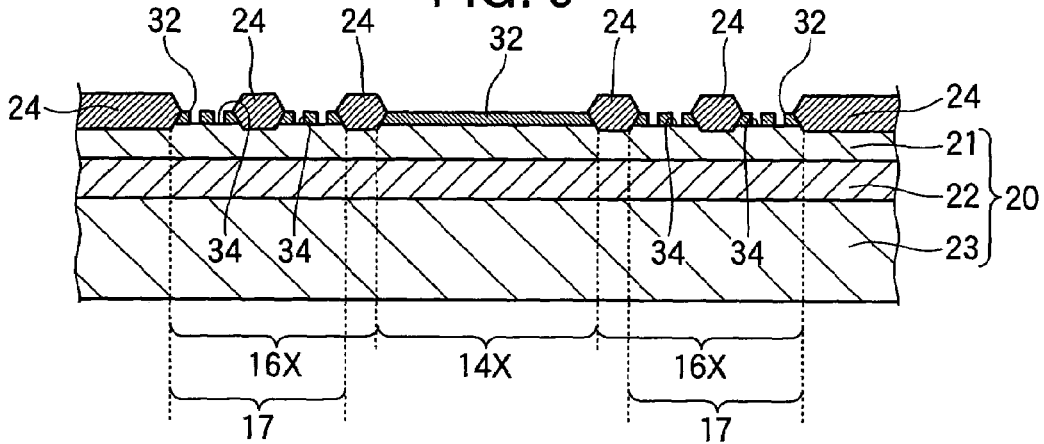

Next, contact holes 34 are formed in the thermal oxide layer 32 by conventional photolithography and etching processes, extending to the piezoresistive functional elements 17 as shown in FIG. 9.

Figure 10:
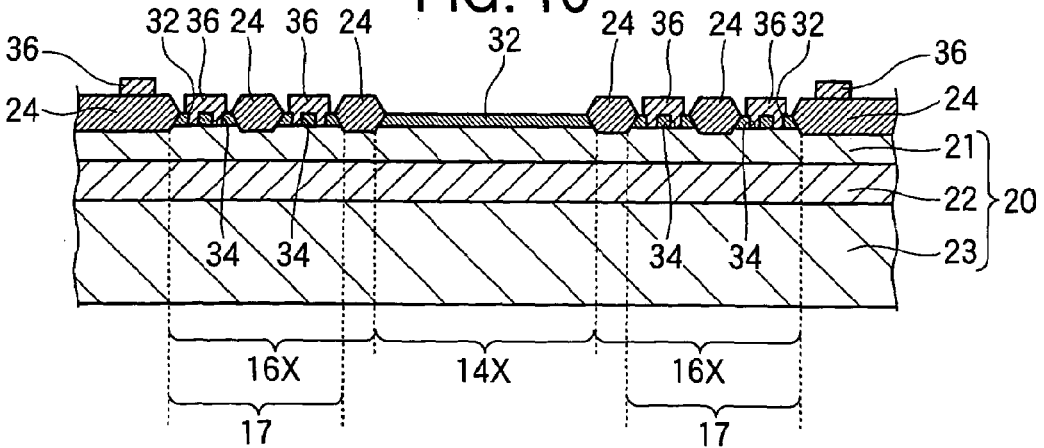

Wiring 36 is then formed by a conventional process on the LOCOS oxide regions 24 and thermal oxide layer 32, as shown in FIG. 10. The wiring 36 fills in the contact holes 34 and makes contact with the piezoresistive functional elements 17, so that the piezoresistive functional elements 17 and wiring 36 are electrically interconnected. The wiring 36 may extend outside the beam areas 16X. In the present embodiment, the wiring 36 extends onto the frame area.

Figure 11:
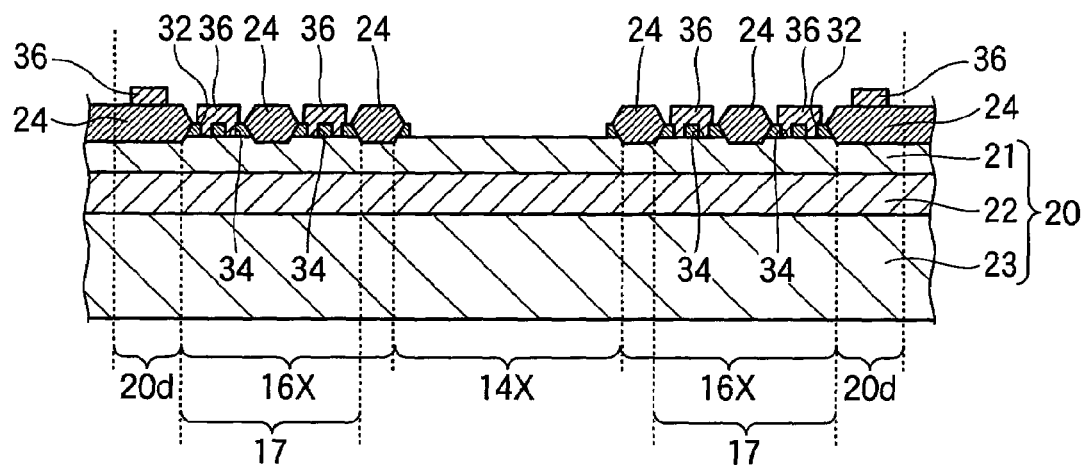

Next, the exposed parts of the thermal oxide layer 32 are removed by well-known methods, leaving the state shown in FIG. 11. The removed parts include all of the thermal oxide layer 32 in the movable member area 14X and part of the thermal oxide layer 32 in the beam areas 16X.

Figure 4:
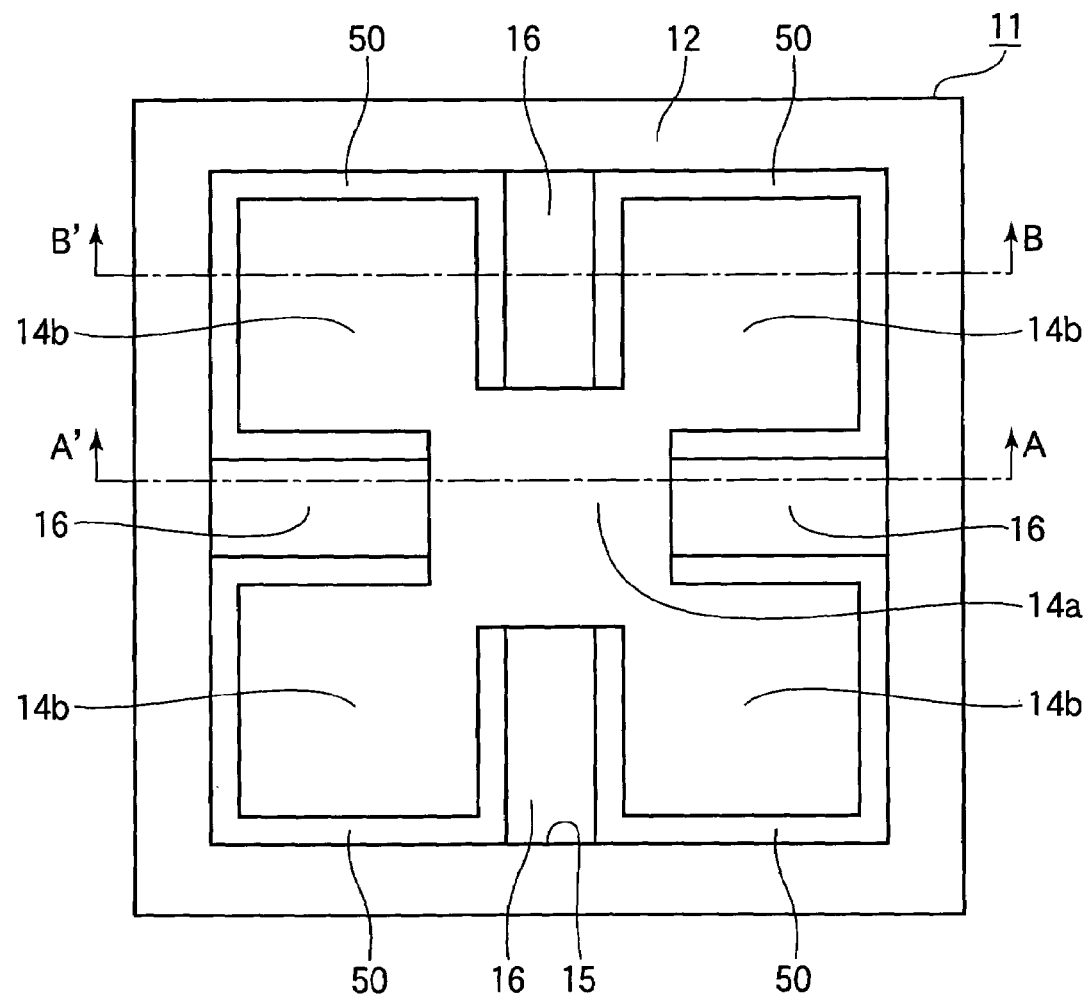
FIG. 4 is a rear plan view of the semiconductor acceleration sensor in FIG. 1.
Figure 12:
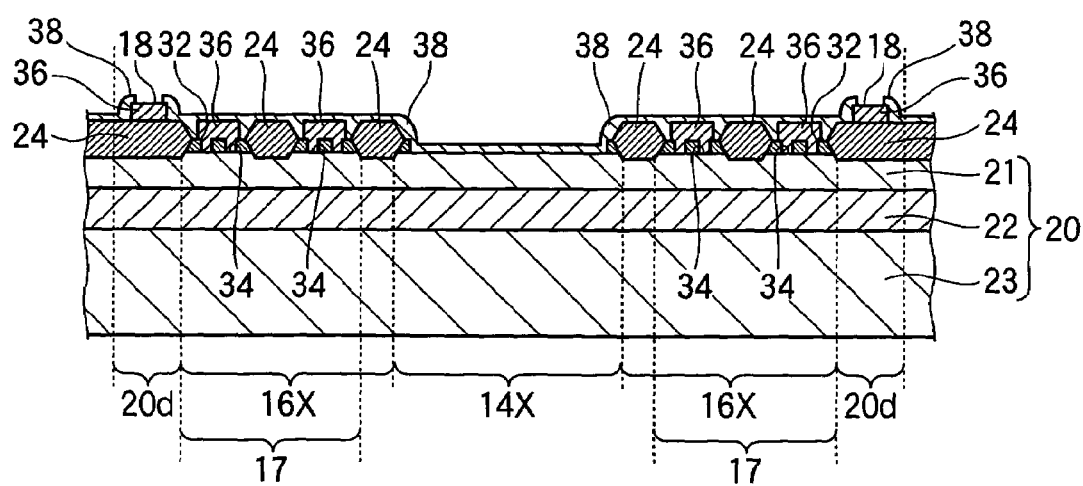
Figure 13:
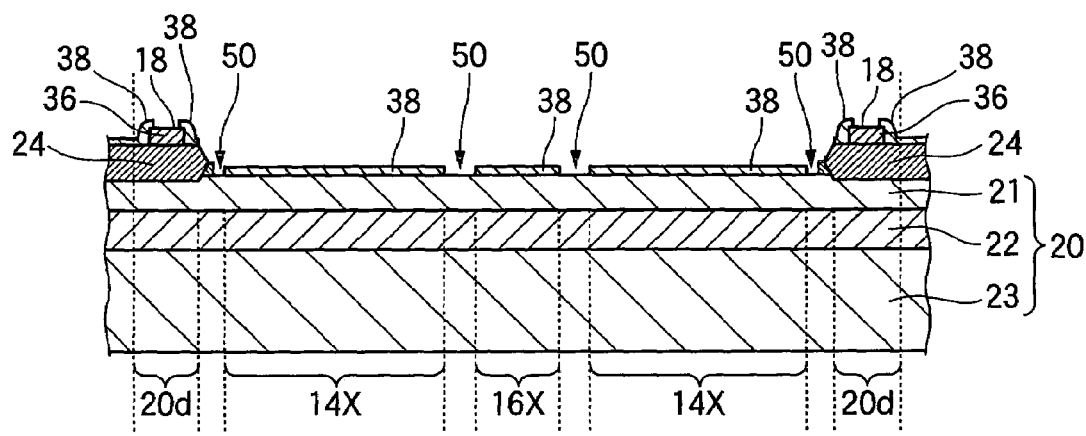

The semiconductor substrate 20 is now covered with a passivation layer 38 of, for example, silicon nitride ($Si_3N_4$) The passivation layer 38 is patterned by conventional photolithography and etching processes to expose part of the wiring 36 in the frame area, thereby forming electrode pads 18 as shown in FIG. 12, which is a sectional view through line A–A' in FIG. 4, and to expose part of the first silicon layer 21 as shown in FIG. 13, which is a sectional view through line B–B' in FIG. 4. The exposed parts of the first silicon layer 21 form the beginnings of the grooves 50 separating the peripheral frame area 20d from the movable member area 14X and the movable member area 14X from the beam areas 16X.

Next, a precursor microstructure 13a including immobilized precursors of the movable member and beams is formed. To obtain the precursor microstructure 13a, the first and second silicon layers 21 and 23 are selectively etched from both major surfaces of the semiconductor substrate 20 to deepen the grooves 50 and form a back recess.

Figure 14:
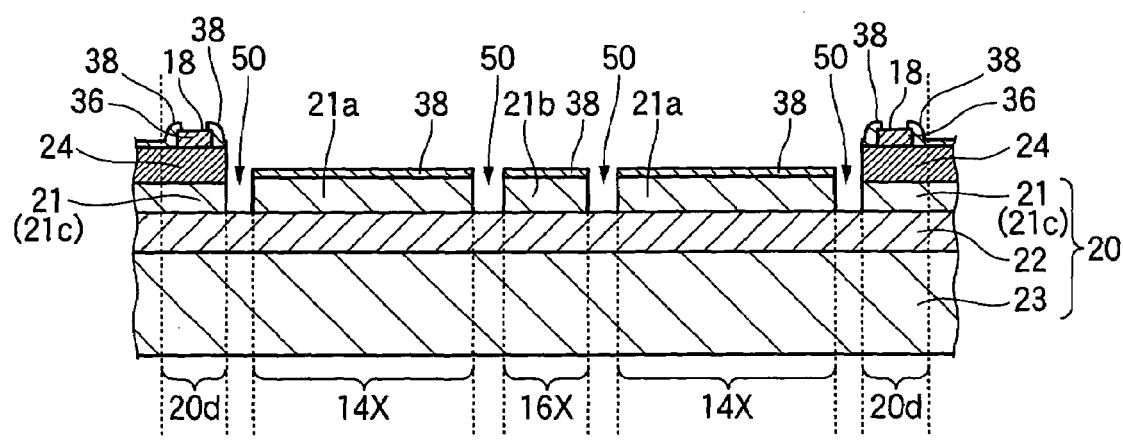

The mask pattern (not shown) that defines the grooves 50 is formed from a thick resist film by a conventional contact or non-contact photolithography process. This mask covers the peripheral frame area 20d, movable member area 14X, and beam areas 16X on the first major surface 20a of the substrate, and exposes areas inside the peripheral frame area 20d but exterior to the movable member area 14 and beam areas 16; the exposed areas separate the movable member area 14X from the beam areas 16X and peripheral frame area 20d. After this mask has been used to etch the passivation layer 38 as shown in FIG. 13, the same mask is used to etch the first silicon layer from its exposed surface down to the surface of the sacrificial layer 22 or BOX layer. The so-called Bosh etching process may be employed, in which an inductively coupled plasma (ICP) of octafluorocyclobutane ($C_4F_8$) is used to protect the side walls and then a silicon hexafluoride ($SiF_6$) etchant is used to etch the first silicon layer. These two steps, the side wall protection step and etching step, are repeated as often as necessary to form deep grooves as shown in FIG. 14.

In this etching process, the sacrificial layer 22 functions as an etch stop layer and is left substantially intact. Therefore, the areas 14X and 16X in which the movable member 14 and beams 16 will be formed are still interconnected by the sacrificial layer 22. After the grooves 50 have been formed, the remaining parts of the first silicon layer are the part 21a in the movable member area 14X, the part 21b in the beam areas 16X, and the part 21c in the peripheral frame area 20d.

Figure 15:
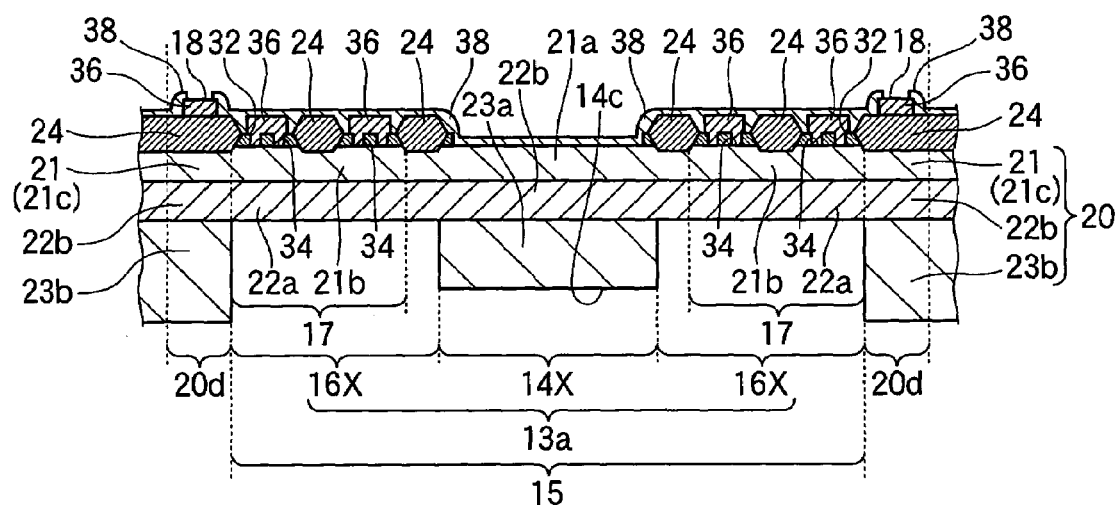
Figure 16:
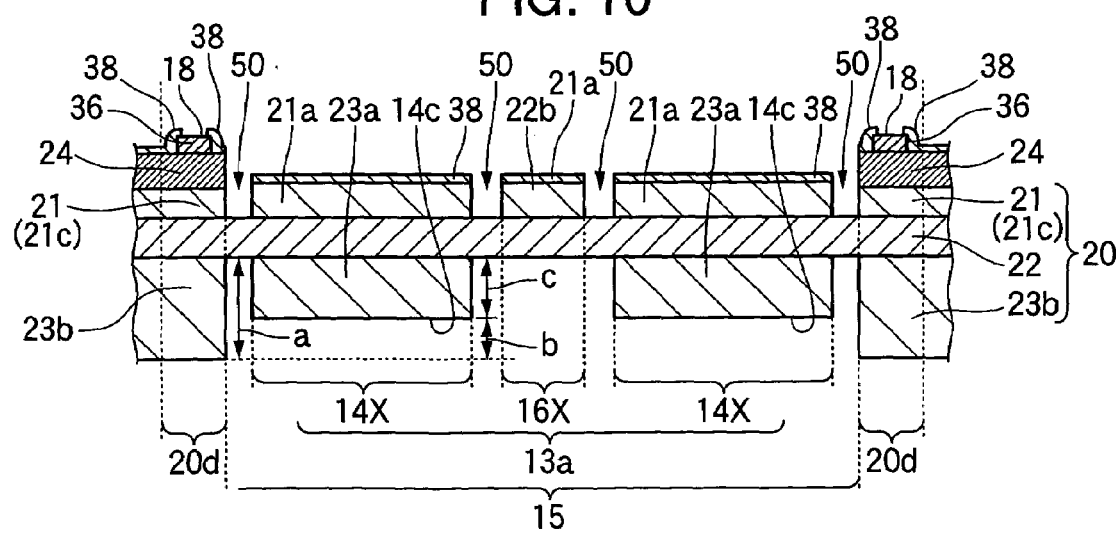

Next, as shown in FIGS. 15 and 16, the second silicon layer 23 is etched from the back (second) side of the substrate to complete the immovable precursor microstructure 13a in which the movable member and beams remain immobilized by the sacrificial layer 22. FIG. 15 is a sectional view through line A–A' in FIG. 4; FIG. 16 is a sectional view through line B–B' in FIG. 4.

Specifically, for example, the semiconductor substrate 20 is turned upside down so that the second major surface 20b is up, and another thick resist mask pattern is formed on the second major surface 20b of the semiconductor substrate 20 by photolithography. The Bosh process described above is used to form deep grooves in the beam areas 16X, the spaces between the movable member area 14X and the beam areas 16X, and the spaces between the movable member area 14X and peripheral frame area 20d. The second silicon layer 23 is entirely removed from these areas, the sacrificial layer 22 functioning as an etch stop layer. The resulting grooves have a first depth (a) equal to the thickness of the second silicon layer 23. This thick resist mask pattern is then removed and yet another thick resist mask pattern is formed, covering the frame 12 and beam areas 16X and exposing the movable member area 14X, and the second silicon layer 23 is etched to a second depth (b) less than the first depth (a). The part of the second silicon layer 23 remaining in the movable member area 14X has a thickness (c) equal to the difference between the first and second depths (a–b). The resulting undersurface 14c of the precursor movable member is recessed by a distance (b) equal to the second depth from the lower surface of the peripheral frame area 20d.

The second depth (b) must of course be less than the thickness of the second silicon layer 23, but it should be great enough so that the undersurface 14c of the movable member remains above the lower surface of the peripheral frame area 20d when the movable member moves under acceleration force during operation of the semiconductor acceleration sensor.

These etching processes create a recess 15 having an uneven surface on the back (second) side of the semiconductor substrate 20, thereby completing the formation of the precursor microstructure 13a. At this stage, the first silicon layer 21b in the beam area 16X is reinforced by the attached sacrificial layer 22, as shown in FIG. 15; the movable member area 14X and peripheral frame area 20d are mutually joined by the sacrificial layer 22, as shown in FIG. 16; and the movable member area 14X and beam area 16×are mutually joined by the sacrificial layer 22 even in the grooves 50, as also shown in FIG. 16. The precursor microstructure 13a is therefore substantially immobile.

Figure 17:
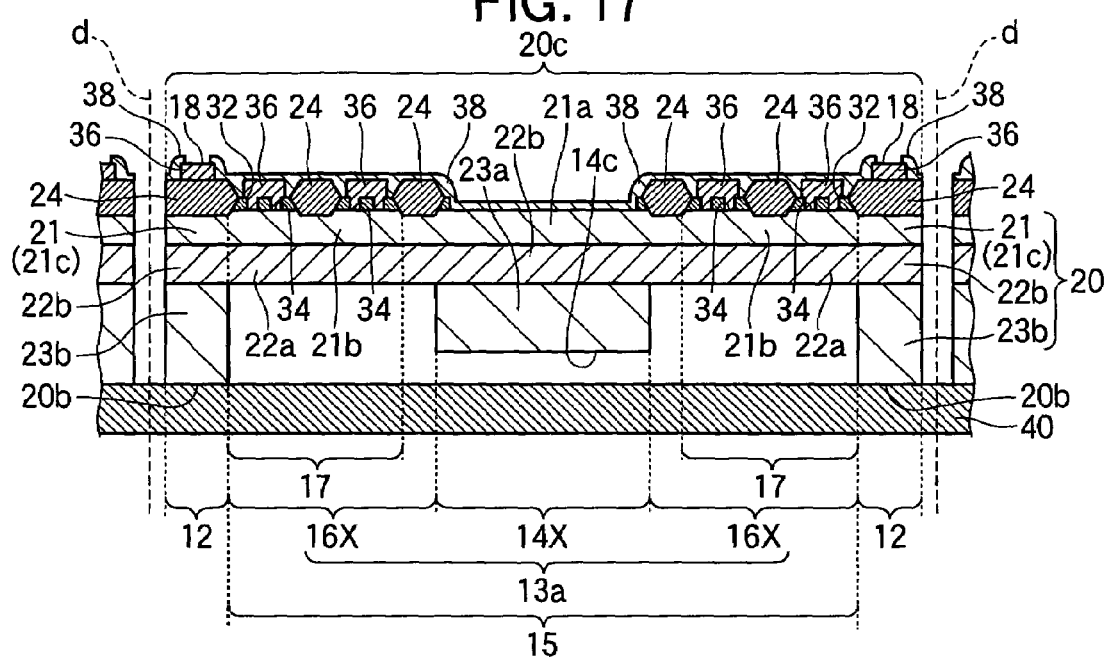

Next, as shown in FIG. 17, an adhesive sheet is attached to the second major surface 20b of the semiconductor substrate 20 so as to cover the recess 15. The surface of attachment includes the lower surface of the frame 12 within each chip area 20c and the lower surface of the areas located between mutually adjacent chip areas 20c.

In the fabrication methods of the first embodiment, the adhesive sheet is a UV sheet as noted above. Commercially available UV sheets can be used. For example, the Adwill (trademark) D-series UV curable dicing tape manufactured by Lintec Corporation may be used.

Next, the semiconductor substrate 20 is diced along dicing lines (d) located in the regions between mutually adjacent chip areas 20c, using conventional dicing equipment. The dicing process cuts through the semiconductor substrate 20 down at least to the surface of the adhesive sheet 40, but does not cut completely through the adhesive sheet; ideally, the adhesive sheet is not cut at all.

In the first fabrication method in the first embodiment, the immobile precursor microstructure 13a is now converted to a movable microstructure 13 by removing the exposed parts 22a of the sacrificial layer 22, thereby enlarging the recess 15. If the sacrificial layer 22 in this embodiment is a silicon oxide layer (BOX layer), a conventional wet etching process may be carried out, using an etchant that does not damage the wiring 36, functional elements 17, and other structural elements. One suitable etchant is a solution of acetic acid ($CH_3COOH$), ammonium fluoride ($NH_3F$), and ammonium hydrogen fluoride ($NH_4F$). The etchant attacks the sacrificial layer 22 through the grooves 50. After eliminating the sacrificial layer from the spaces between the movable member area 14X and the beam areas 16X, and the spaces between the movable member area 14X and the frame 12, the etchant proceeds to remove the sacrificial layer 22 from the backs of the beam areas 16X. The remaining part 22b of the sacrificial layer 22 is sandwiched between the first silicon layer 21 and the remaining parts 23a, 23b of the second silicon layer 23, which the above etchant does not etch.

As a result of this etching process, the movable member 14 is freed from the frame 12 and the sides of the beams 16, and the beams 16 are left attached only at their ends to the frame 12 and movable member 14. Removal of the sacrificial layer 22 from the undersides of the beams 16 leaves the beams 16 flexible enough to bend, allowing the movable member 14 to move in response to acceleration forces.

Figure 18:
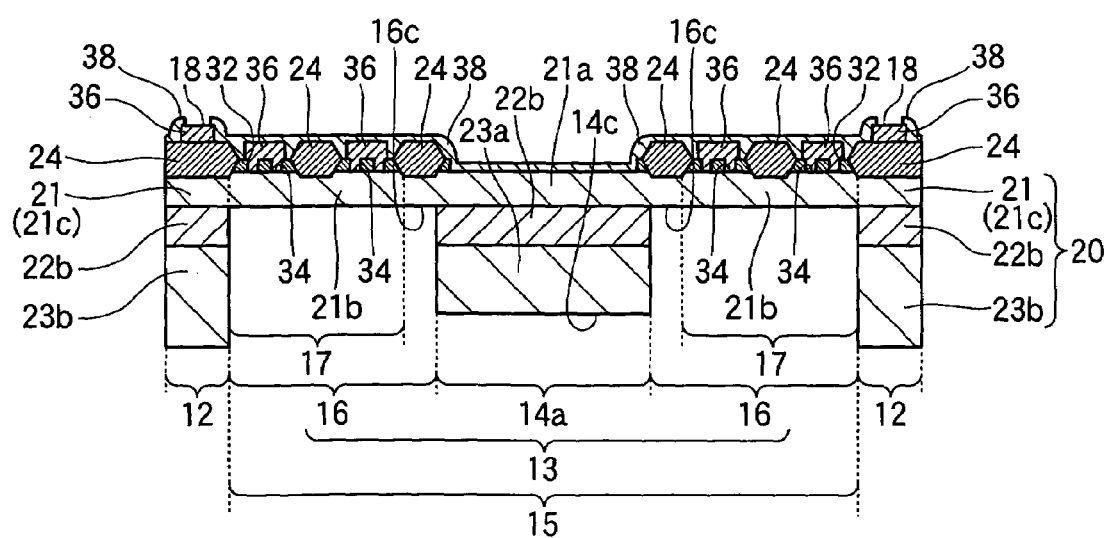

Next the adhesive sheet 40 is removed, leaving the individual chips into which the semiconductor substrate 20 has been diced. FIG. 18 shows one such chip. In the first fabrication method in the first embodiment, the adhesive sheet 40 is now irradiation with ultraviolet light to weaken its adhesion to the semiconductor substrate 20. The ultraviolet irradiation dose is preferably sufficient to reduce adhesion between the semiconductor substrate 20 and the adhesive sheet 40 to substantially nil, allowing the chips into which the semiconductor substrate 20 has been diced to be detached readily from the adhesive sheet. The necessary amount of ultraviolet irradiation varies, depending on the particular type of UV sheet used.

In the first fabrication method of the first embodiment, when the dicing process is performed, the movable member and beams constituting the microstructure are reinforced and immobilized by the sacrificial layer to mitigate the stress acting on the beams. During the dicing process, the substrate is held together by the adhesive sheet. After the dicing process, a final etching step is performed to trim the beams and free the movable member in each chip; then the adhesive sheet is cured to weaken its adhesion and peeled off without stressing or otherwise damaging the microstructure comprising the movable member and beams. This simple process avoids mechanical damage to the device during the manufacturing process, particularly the dicing process during which the microstructure is vulnerable to damage in conventional fabrication processes. Compared with these conventional fabrication processes, the process illustrated in FIGS. 5 to 18 can provide significantly improved manufacturing yields, thereby reducing the manufacturing cost per chip.

If an SOI wafer is used as a substrate, its existing buried oxide (BOX) layer can be directly used as the sacrificial layer. The invented fabrication method then becomes less expensive than conventional fabrication methods that require extra steps to add and then remove additional material to reinforce the beams, and the manufacturing cost per chip is further reduced.

For these reasons, MEMS devices manufactured by the invented method can be less expensive than similar devices manufactured by conventional fabrication methods.

The second fabrication of the first embodiment method differs from the first fabrication method in that the UV irradiation step is performed before the sacrificial layer is etched to complete the microstructure, instead of after the sacrificial layer is etched. The second fabrication method also differs from the first fabrication method in regard to the etching process by which the sacrificial layer is etched. All other steps in the second fabrication method are substantially the same as the corresponding steps in the first fabrication method; detailed descriptions of these other steps will be omitted.

In the second fabrication method, the precursor microstructure 13a is formed by the same sequence of processes as in the first fabrication method, illustrated in FIGS. 5 to 16; then the adhesive sheet 40 is attached and the semiconductor substrate 20 is diced as shown in FIG. 17. As in the first fabrication method, a UV sheet is used as the adhesive sheet 40.

Next, the UV sheet (the adhesive sheet) is irradiated with ultraviolet light to weaken its adhesion to the semiconductor substrate 20. The level of ultraviolet irradiation is selected so as to weaken the adhesion sufficiently that the UV sheet can be detached from the semiconductor substrate 20 later, but not to weaken the adhesion so much that the UV sheet will detach of its own accord during the acid etching process described below. The specific level of irradiation depends on the type of UV sheet used. The UV sheet is left attached at this stage.

After UV irradiation, the precursor microstructure 13a is converted to a microstructure 13 by removing the parts 22a of the sacrificial layer 22 (BOX layer) that reinforce the beams 16 from the back and connect the movable member 14 to the beams 16 and frame 12. The result is the same as in the first fabrication method: the movable member 14 is freed, and the beams 16 become sufficiently flexible that the intended acceleration can be measured. The microstructure 13 comprising the movable member 14 and beams 16 accordingly becomes a movable structure.

In the second fabrication method, the sacrificial layer 22 is removed by an acid process instead of the process described in the first fabrication method. The acid process may be carried out in, for example, a conventional parallel plate chemical vapor deposition (CVD) reactor with a reaction chamber which is evacuated to a low-pressure state, then supplied with a predetermined mixture of gases. Hydrogen fluoride (HF) and gaseous water ($H_2O$), for example, may be supplied to the chamber. Exemplary reaction conditions are a hydrogen fluoride gas flow rate of five hundred standard cubic centimeters per minute (500 sccm), a gaseous water flow rate of 100 sccm, a reaction pressure of twelve kilopascals (12 kPa), and a reaction temperature of eighty degrees Celsius (80 C).

This reaction completes the microstructure 13 by removing the exposed part 22a of the sacrificial layer 22 (BOX layer). Finally, the adhesive sheet 40 (the UV sheet) is peeled away from the semiconductor substrate 20, leaving a plurality of completed MEMS devices.

The acid process described above does not separate the UV sheet from the semiconductor substrate 20 even though the adhesive strength of the UV sheet has been reduced by ultraviolet irradiation. Performing the UV irradiation step before removing the sacrificial layer 22 eliminates the possibility that an unwanted reaction between the etchant used to remove the sacrificial layer 22 and the adhesive of the UV sheet might alter the properties of the adhesive in such a way as to render subsequent ultraviolet irradiation ineffective; that is, the possibility that ultraviolet irradiation might not reduce the adhesive strength of the UV sheet sufficiently to permit easy detachment of the completed MEMS chips is eliminated. The second fabrication method assures that the MEMS device can be fabricated with high yield regardless of the type of UV sheet used.

The acid process using hydrogen fluoride as an etchant as described above also has the advantage of reducing or substantially eliminating etchant damage to the UV sheet, making the UV sheet easier to remove from the substrate.

SECOND EMBODIMENT

The second embodiment replaces the UV sheet used in the first embodiment with a so-called thermal release sheet. The thermal release sheet is an adhesive sheet having an adhesive that weakens when heated to a predetermined temperature, so that the sheet peels away easily from the object to which it is attached. In other respects, the second embodiment is similar to the first embodiment.

A first fabrication method according to the second embodiment of the invention will now be described. In the first fabrication method, after the precursor microstructure 13a has been formed, the semiconductor substrate 20 is secured to an adhesive sheet of the thermal release type and diced into chips; then the microstructure in each chip is completed by removing the sacrificial layer, after which the adhesive sheet is heated and peeled off. All processes preceding the attachment of the adhesive sheet are substantially the same as in the first embodiment, so detailed descriptions will be omitted.

The processes illustrated in FIGS. 5 to 16 are carried out as described in the first embodiment to complete the precursor microstructure 13a.

Next, as shown in FIG. 17, the adhesive sheet 40 is attached to the second major surface 20b of the semiconductor substrate 20, covering the recess 15. A commercially available thermal release sheet can be used as the adhesive sheet. One preferred thermal release sheet is the REVAL-PHA thermal release tape manufactured by Nitto Denko Corporation.

Next dicing is performed, using conventional dicing equipment, along the dicing lines (d) indicated in FIG. 17.

Next, the precursor microstructure 13a is converted to a microstructure 13 as described in the first fabrication method in the first embodiment, by etching parts 23a of the sacrificial layer 22.

Next, the already diced semiconductor substrate 20 and the attached thermal release sheet are heated to a predetermined temperature that weakens the adhesion between them, and the adhesive sheet is detached to obtain a plurality of semiconductor acceleration sensors, one of which is shown in FIG. 18. The appropriate heating temperature and time depend on the specific thermal release sheet used.

In the first fabrication method of the second embodiment, damage to the device during the fabrication process can be effectively prevented, and the manufacturing yield of the device can be significantly improved. If an SOI wafer is used as a substrate, so that its existing buried oxide (BOX) layer can be directly used as the sacrificial layer, the first fabrication method of the second embodiment also becomes less expensive than conventional fabrication methods that require extra steps to add and then remove additional material to protect the device during dicing.

The inventor has found that the adhesive material of the thermal release sheet mentioned above is more resistant to etchants, particularly to acid etchants, than is the adhesive material of the UV sheet used in the first embodiment. Accordingly, the adhesive material of the thermal release sheet is less likely to undergo unwanted changes during the etching process that completes the microstructure, even if the etching process is carried out before the heating process. The effects obtained in the first fabrication method in the first embodiment are therefore enhanced in the first fabrication method in the second embodiment.

The second fabrication method of the second embodiment differs from the first fabrication method of the second embodiment in that the heating process that weakens the adhesive in the thermal release sheet is performed before the sacrificial layer is removed to complete the microstructure 13. The sacrificial layer is removed by an acid process as described in the second fabrication method of the first embodiment.

The second fabrication method of the second embodiment is substantially the same as the second fabrication method of the first embodiment, except that the adhesive sheet is a thermal release sheet instead of a UV sheet, and a heating step is used instead of an ultraviolet irradiation step. Detailed descriptions of the steps preceding the heating step will be omitted After the precursor microstructure 13a has been formed by the sequence of processes described in the first embodiment, illustrated in FIGS. 5 to 16, the thermal release sheet 40 is attached and the semiconductor substrate 20 is diced as illustrated in FIG. 17.

Next, the semiconductor substrate 20 and the thermal release sheet 40 are heated to weaken the adhesion between them. The heating temperature and time are selected so that the adhesion is weakened sufficiently to permit the thermal release sheet 40 to be detached after the acid process that completes the formation of the microstructure 13, but is not weakened so much that it will detach during the acid process. The optimum heating temperature and time depend on the particular type of thermal release sheet used. The thermal release sheet is left attached at this stage.

The microstructure 13 is now completed by removing parts 22a of the sacrificial layer 22 (BOX layer), at least including the parts that join the movable member 14 to the frame 12 and beams 16 and the parts that reinforce the beams 16 from the back. As a result, the movable member 14 is freed to move and the beams 16 become flexible enough to permit the movable member 14 to move by the amount necessary to measure the acceleration forces of interest. The sacrificial layer 22 is removed by the same acid process as in the second fabrication method of the first embodiment, using hydrogen fluoride in a conventional parallel plate CVD reactor with the reaction conditions described in the first embodiment.

Finally, the thermal release sheet 40 is peeled away from the semiconductor substrate 20 to obtain a plurality of MEMS devices.

The acid process described above does not separate the thermal release sheet from the semiconductor substrate 20 even though the adhesive strength of the thermal release sheet has been reduced by heating. Performing the heating step before removing the sacrificial layer 22 eliminates the possibility that an unwanted reaction between the etchant used to remove the sacrificial layer 22 and the adhesive of the thermal release sheet might alter the properties of the adhesive in such a way that subsequent heating would not effectively reduce its adhesive strength. Accordingly, the second fabrication method assures that MEMS devices can be fabricated with high yield, regardless of the type of thermal release sheet used. An acid process using hydrogen fluoride as an etchant as described above also has the advantage of reducing or substantially eliminating etchant damage to the thermal release sheet, making the thermal release sheet easier to detach from the substrate.

The MEMS devices in the embodiments described above are piezoelectric acceleration sensors, but the invention is not limited to this type of device. The invented MEMS fabrication method can also be advantageously applied to the fabrication of capacitive acceleration sensors, pressure sensors, gyros, optical switches, digital mirror devices, and any other type of MEMS device having a microstructure that is vulnerable to damage during the dicing step in the fabrication process.

Those skilled in the art will recognize that further variations are possible within the scope of the invention, which is defined in the appended claims.

What is claimed is:

1. A method of fabricating a micro-electrical-mechanical system (MEMS) device, the method comprising:
    preparing a substrate having a first side, a second side, a first semiconductor layer on the first side, a second semiconductor layer on the second side, and a sacrificial layer sandwiched between the first and second semiconductor layers, the substrate including a plurality of chip areas, each chip area including a peripheral area and an interior area disposed within the peripheral area;
    selectively etching the substrate from both the first side and the second side to remove part of the first semiconductor layer and part of the second semiconductor layer from the interior area of each chip area without removing the sacrificial layer, thereby leaving a frame in the peripheral area and forming, within each interior area, a microstructure having a movable member, the movable member being immobilized to the frame by the sacrificial layer;
    preparing a sheet having an adhesive surface;
    attaching the adhesive surface of the sheet to the remaining parts of the second side of the substrate;
    dicing the substrate from the first side down at least to the adhesive surface of the sheet, thereby dividing the substrate into chips;
    etching exposed parts of the sacrificial layer, thereby freeing the movable member from the frame, after the substrate has been diced into chips; and
    detaching the chips from the sheet.

2. The method of claim 1, further comprising:
    weakening adhesion between the sheet and the substrate before detaching the chips from the sheet.

3. The method of claim 2, wherein weakening the adhesion comprises exposing the sheet to ultraviolet light.

4. The method of claim 2, wherein weakening the adhesion comprises exposing the sheet to heat.

5. The method of claim 2, wherein weakening the adhesion is performed after etching the exposed parts of the sacrificial layer.

6. The method of claim 2, wherein weakening the adhesion is performed after dicing the substrate and before etching the exposed parts of the sacrificial layer.

7. The method of claim 1, wherein the first and second semiconductor layers are silicon layers.

8. The method of claim 7, wherein the sacrificial layer is a silicon oxide layer.

9. The method of claim 7, wherein etching exposed parts of the sacrificial layer comprises etching with acetic acid.

10. The method of claim 7, wherein etching exposed parts of the sacrificial layer comprises etching with ammonium fluoride.

11. The method of claim 7, wherein etching exposed parts of the sacrificial layer comprises etching with ammonium hydrogen fluoride.

12. The method of claim 7, wherein etching exposed parts of the sacrificial layer comprises etching with hydrogen fluoride.

13. The method of claim 7, wherein etching exposed parts of the sacrificial layer comprises a Bosh etching process.

14. The method of claim 1, wherein the microstructure also includes at least one beam attaching the movable member to the frame, the at least one beam being formed in the first semiconductor layer, the movable member being formed in the first semiconductor layer, the sacrificial layer, and the second semiconductor layer, the interior of each chip area thus including a first part in which the movable member is formed, a second part in which the at least one beam is formed, and a third part exterior to the first and second parts.

15. The method of claim 14, wherein the movable member and the at least one beam are formed as a unitary structure in each interior area.

16. The method of claim 14, wherein said selectively etching the substrate comprises:
    etching the first semiconductor layer down to the sacrificial layer in the third part of the interior area of each chip area, without etching the sacrificial layer; and
    etching the second semiconductor layer down to the sacrificial layer in the second and third parts of the interior area of each chip area, without etching the sacrificial layer.

17. The method of claim 15, wherein said selectively etching the substrate further comprises etching the second semiconductor layer partway down to the sacrificial layer in the first part of the interior area of each chip area, without etching the sacrificial layer.

18. The method of claim 1, wherein the substrate is a silicon-on-insulator substrate.

* * * * *